(12) United States Patent
Stout

(10) Patent No.: US 10,338,363 B1
(45) Date of Patent: Jul. 2, 2019

(54) ENVIRONMENTALLY-SEALED REFRACTIVE LIGHTING OPTIC

(71) Applicant: HONEYWELL INTERNATIONAL INC., Morris Plains, NJ (US)

(72) Inventor: Bo Stout, Springfield, OH (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

(21) Appl. No.: 15/845,094

(22) Filed: Dec. 18, 2017

(51) Int. Cl.
| | |
|---|---|
| F21V 5/00 | (2018.01) |
| G02B 17/08 | (2006.01) |
| H01L 33/62 | (2010.01) |
| F21V 19/00 | (2006.01) |
| G02B 19/00 | (2006.01) |
| G02B 3/00 | (2006.01) |

(52) U.S. Cl.
CPC .......... *G02B 17/086* (2013.01); *F21V 19/002* (2013.01); *G02B 3/0068* (2013.01); *G02B 19/0028* (2013.01); *G02B 19/0061* (2013.01); *H01L 33/62* (2013.01)

(58) Field of Classification Search
CPC ...... B60Q 1/302; B60Q 1/38; B60Q 2400/10; B60Q 2400/30; F21S 41/16; F21S 43/14; F21S 43/15; F21S 43/19; F21S 43/239
USPC .......................................................... 362/328
See application file for complete search history.

(56) References Cited

U.S. PATENT DOCUMENTS

| | | | |
|---|---|---|---|
| 6,204,523 B1 | 3/2001 | Carey et al. | |
| 8,419,232 B2 | 4/2013 | Minano et al. | |
| 2004/0116640 A1 | 6/2004 | Miyoshi | |
| 2010/0135038 A1* | 6/2010 | Handschy | G02B 6/0035 362/606 |
| 2012/0078241 A1* | 3/2012 | Gooding | A61F 9/009 606/6 |
| 2012/0306940 A1* | 12/2012 | Machida | G02B 6/005 345/690 |
| 2013/0102922 A1* | 4/2013 | Gooding | A61B 3/14 600/558 |
| 2013/0103009 A1* | 4/2013 | Gooding | A61F 9/00827 606/4 |
| 2014/0146543 A1 | 5/2014 | Ben Levy | |
| 2014/0211449 A1* | 7/2014 | Nomura | B60Q 1/302 362/84 |

(Continued)

FOREIGN PATENT DOCUMENTS

WO      2011023927 A1      3/2011

OTHER PUBLICATIONS

Hopmann, C. et al; Producing an integrated primary optic with focus head of an LED from LSR using an innovative IM technology; International Polymer Science and Technology, vol. 42, No. 5, 2015.

*Primary Examiner* — Thien M Le
(74) *Attorney, Agent, or Firm* — Lorenz & Kopf, LLP

(57) ABSTRACT

An environmentally-sealed refractive lighting optic includes a single light-emitting diode (LED) printed circuit card that includes a plurality of LED components and a single, refractive optic element retained directly to the LED printed circuit card in a self-sealing manner without mechanical fasteners. The refractive optic element is configured to environmentally seal the LED components on the LED printed circuit card. Further, the refractive optic element may include a liquid silicone rubber material or an optically-clear low-pressure molded room temperature vulcanizing (RTV) silicone material.

15 Claims, 5 Drawing Sheets

(56) References Cited

U.S. PATENT DOCUMENTS

2016/0332746 A1 11/2016 Williams
2017/0052319 A1 2/2017 Schultheis et al.
2017/0234511 A1 8/2017 Rapisarda

* cited by examiner

ENVIRONMENTALLY-SEALED REFRACTIVE LIGHTING OPTIC

TECHNICAL FIELD

The present disclosure generally relates to lighting systems. More particularly, the present disclosure relates to an environmentally-sealed refractive lighting optic that may be used for aircraft anti-collision lighting.

BACKGROUND

Aircraft utilize a variety of lights to attract the attention of other aircraft operating in the same airspace, in order to prevent collisions between aircraft. One such lighting system is the anti-collision lighting system. An anti-collision lighting system may include flashing lights installed at several points on the aircraft to ensure that the lighted aircraft is visible to other aircraft operating in the vicinity. Anti-collision lights are typically mounted on the aircraft's upper and lower fuselage, the tail, and the wingtips, for example.

Anti-collision lights have previously been installed on aircraft for this purpose, but they suffer from several disadvantages. Prior anti-collision lights use "strobe" lights owing to the strobe's brilliant, sharp flash and high light output. In a strobe lighting system, aircraft electrical power is converted to a high-voltage direct current (DC) potential. The high-voltage DC is applied to a xenon gas lamp, which is "triggered" to arc between its anode and cathode terminals by a second voltage which is applied to the lamp's grid terminal. These prior strobe lights suffer from a relatively short service life due to degradation of the strobe's electronic components as a result of the continuous high-voltage charge and discharge cycles associated with each flash of the lamp. This is particularly true when the aircraft is operated in damp environments and at high altitudes.

Light-emitting-diodes (LEDs) are presently being adopted for various aircraft lighting systems. Some of the benefits of LEDs include longer life, lower power, lighter module packages, etc. However, many LED systems are not designed to fit into existing aircraft light module housings, thereby making replacement of xenon, incandescent, or halogen lamps with LEDs an expensive and time-consuming process.

Accordingly, it is desirable to provide an improved lighting optic for use in aircraft anti-collision lighting systems. Furthermore, other desirable features and characteristics of the present invention will become apparent from the subsequent detailed description and the appended claims, taken in conjunction with the accompanying drawings and the foregoing technical field and background.

BRIEF SUMMARY

According to various embodiments, an environmentally-sealed refractive lighting optic includes a single light-emitting diode (LED) printed circuit card that includes a plurality of LED components and a single, refractive optic element retained directly to the LED printed circuit card in a self-sealing manner without mechanical fasteners. The refractive optic element is configured to environmentally seal the LED components on the LED printed circuit card. Further, the refractive optic element may include a liquid silicone rubber material or an optically-clear low-pressure molded room temperature vulcanizing (RTV) silicone material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

DESCRIPTION OF THE DRAWINGS

The exemplary embodiments will hereinafter be described in conjunction with the following drawing figures, wherein like numerals denote like elements, and wherein.

DETAILED DESCRIPTION

The following detailed description is merely exemplary in nature and is not intended to limit the inventive subject matter or the application and uses of the inventive subject matter. Furthermore, there is no intention to be bound by any theory presented in the preceding background or the following detailed description.

The present disclosure relates to an environmentally-sealed refractive lighting optic that may be used for aircraft anti-collision lighting. The presently-described embodiments utilize a refractive optic element in place of typical reflector optic in order to remove the electrical arc path in metalized reflectors, which is particularly beneficial for use in damp environments and at high altitudes. Moreover, the presently-described embodiments simplify the lighting optic by using a single LED circuit card and single optic element part. This allows the LED lighting optic to be utilized as a form and fit replacement for existing xenon tubes and reflectors. Still further, the presently-described embodiments completely environmentally seal the LED components on the LED printed circuit card using a non-conductive refractive optic element. This configuration allows the optic element to be retained directly to the LED printed circuit card to improve the optic tolerance condition while using no mechanical fastener components and providing an environmental seal for the LEDs. Accordingly, the presently-described embodiments are expected to significantly reduce the size, weight, and power consumption of aircraft anti-collision lighting systems, while increasing their service life.

Figure 1:
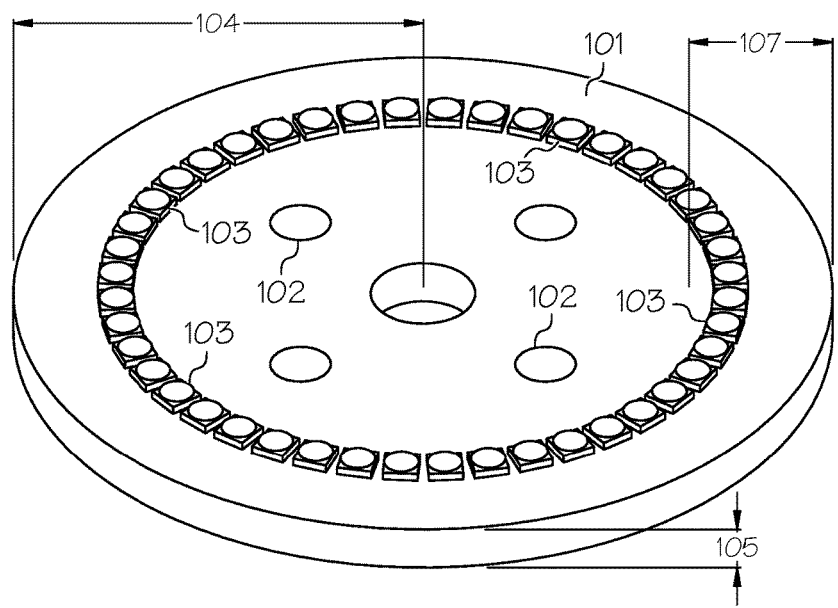
FIG. 1 is a perspective illustration of a single LED printed circuit card including a plurality of LED components in accordance with some embodiments of the present disclosure.

FIG. 1 is an illustration of a single LED printed circuit card assembly 100 including a plurality of LED components in accordance with some embodiments of the present disclosure. As shown in FIG. 1, the printed circuit card assembly 100 includes a printed circuit card 101. As used herein, the term printed circuit card generally refers to a device that mechanically supports and electrically connects electronic and/or electrical components using conductive tracks, pads and other features etched from conductive sheets laminated onto a non-conductive substrate. LEDs are generally soldered onto the printed circuit card at the conductive pads for a mechanical and electrical connection to the printed circuit card. The illustrated printed circuit card 101 is generally circular in shape, although other shapes are possible, such as square or rectangular, etc., or an irregular shape if the specific implementation so requires. Moreover, a thickness 105 of the printed circuit card 101, as illustrated, is about 10% of its radius 104, but again, this is an application-dependent factor and may vary. The materials used to make the printed circuit card 101 are not particularly limited, with the proviso that the electrical tracks and pads should be electrically conductive, whereas the substrate should be electrically insulating. The printed circuit card 101 may include one or more holes or other openings 102 that allow the card to be secured to a base portion of an aircraft anti-collision lighting module (with appropriate fastener(s)), as will be described in greater detail below.

The printed circuit card 101 includes a plurality of LED components 103 that are physically and electrically connected to the printed circuit card 101. As used herein, the term LED component generally refers to a two-lead semiconductor light source. It is a p-n junction diode that emits light when activated. When a suitable voltage is applied to the leads, electrons are able to recombine with electron holes within the device, releasing energy in the form of photons. This effect is called electroluminescence, and the color of the light (corresponding to the energy of the photon) is determined by the energy band gap of the semiconductor. The particular number of LED components 103 affixed to the printed circuit card 101 may vary widely from embodiment to embodiment, depending on lighting intensity, energy, lighting pattern, and other requirements as may be applicable. In the embodiment shown, the LED components 103 are disposed in an annular pattern about a periphery 107 (e.g., outer 50% or less of the radius 104) of the printed circuit card 101, although various other locations, patterns, etc. are possible depending on the requirements for a particular embodiment. The spacing between LED components 103 also will vary depending on the embodiment.

Figure 2:
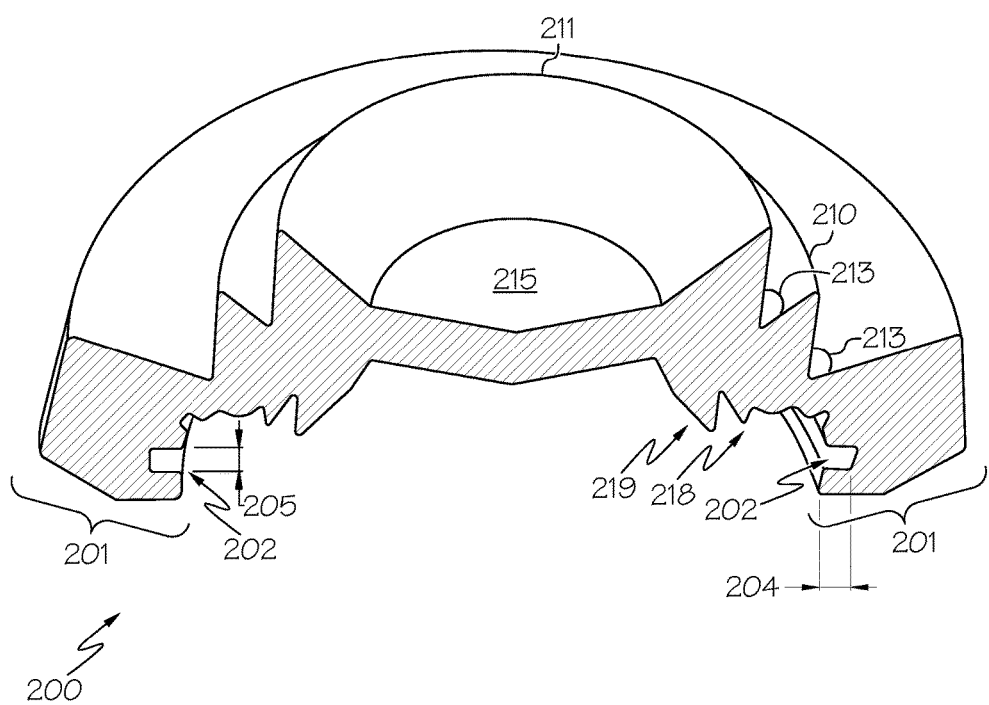
FIG. 2 is a cross-sectional illustration of a single, refractive optic element that is configured to be retained directly to the LED printed circuit card in a self-sealing manner without mechanical fasteners in accordance with some embodiments of the present disclosure.

FIG. 2 is an illustration of a single, refractive optic element 200 that is configured to be retained directly to the LED printed circuit card assembly 100 in a self-sealing manner without mechanical fasteners in accordance with some embodiments of the present disclosure. As used herein, the term refractive optic element generally refers to an optic element configured such that the light emitted from the LED components 103 enters the optic element at an oblique angle so as to cause refraction of the emitted light. Refraction is a phenomenon that often occurs when light waves travel from a medium with a given refractive index to a medium with another at an oblique angle. At the boundary between the media, the wave's phase velocity is altered, usually causing a change in direction of the light waves.

With regard to the self-sealing feature of optic element 200, optic element 200 includes a sealing perimeter portion 201 that includes an annular notch or cut-out 202. The annular notch 202 extends a radial distance 204 into the sealing perimeter portion 201. The annular notch 202 has a thickness 205 (perpendicular to the radial direction) that is similar (such as +/−10%) in dimension with respect to the thickness 105 of the printed circuit card 101. Distance 204 and thickness 205 may be similar, or one may be larger than the other, in terms of dimension. In the illustrated embodiment, they are similar (i.e., vary less than about 25%). The annular notch 202 is configured such that the periphery of the printed circuit card 101, radially outward from the LED components 103, is able to fit there-within. In this manner, with the periphery of the printed circuit card 101 retained within the annular notch 202, the LED component-containing surface of the printed circuit card 101 is retained fully within the bounds of the optic element 200, with the sealing perimeter portion 201 thereof being fully disposed about the perimeter of the printed circuit card 101. This self-sealing feature helps to keep moisture and other environmental contaminants away from the LED component-containing surface of the printed circuit card 101, and as such is referred to as an environmental seal. Because the seal functions on the basis of the shape of the notch 202 and the sealing perimeter portion 201, there is no need for mechanical fasters (such as screws or clips) to retain the optic element 200 to the printed circuit card assembly 100, which is referred to herein as self-sealing.

With regard to the refractive feature of optic element 200, optic element 200 includes one or more angular features 210, 211. As light passes through these features 210, 211, bending of the emitted LED light can occur. In the illustrated embodiment, angular feature 210 is generally circular, and is disposed radially inward from the sealing perimeter portion 201, and extends to a height (away from the printed circuit card assembly 100) that is greater than that of the sealing perimeter portion 201. Likewise, as illustrated, angular feature 211 is generally circular, and is disposed radially inward from the angular feature 210, and extends to a height that is greater than that of the angular feature 210. One or more circular "valley"-type features 213 may separate the angular feature 210 from the sealing perimeter portion 201, and the angular feature 211 from the angular feature 210. A "bowl"-type feature 215 may exist within the angular feature 211, as illustrated. In some embodiments, furthermore, inward-facing (i.e., towards the printed circuit card assembly 100) angular features 218, 219 may be provided as part of the optic element 200 in order to enhance the refraction of the emitted LED light. Of course, in other embodiments, more or fewer angular features may be provided (both outward and inward facing), at differing locations, in different shapes (i.e., non-circular shapes), and at different heights, depending on the requirements of a given application/implementation. As such, the optic element 200 forms a continuous cover and environmental seal over the LED-containing surface of the printed circuit card assembly 100, wherein this continuous cover is formed and shaped so as to refract the light emitted by the LED components 103.

The optic element 200 may be made using a liquid silicone rubber material or an optically-clear low-pressure molded room temperature vulcanizing (RTV) silicone material. Liquid silicone rubber is a high-purity platinum cured silicone with low compression set, great stability and ability to resist extreme temperatures of heat and cold. Chemically, silicone rubber is a family of thermoset elastomers that have a backbone of alternating silicon and oxygen atoms and methyl or vinyl side groups. Silicone rubbers maintain their mechanical properties over a wide range of temperatures and the presence of methyl-groups in silicone rubbers makes these materials extremely hydrophobic. The shape of optic element 200 may be produced using a process such as injection molding of the liquid silicone rubber material, for example. RTV silicone is a type of silicone rubber made from a two-component system: base plus curative. RTV silicones can be cured with a catalyst consisting of either platinum or a tin compound such as dibutyltin dilaurate. RTV silicones are used for their ability to withstand mechanical and thermal stress. The shape of optic element 200 may be produced using a suitable mold in connection with the RTV silicone. Of course, other suitable materials may be used in alternative embodiments.

Figure 3:
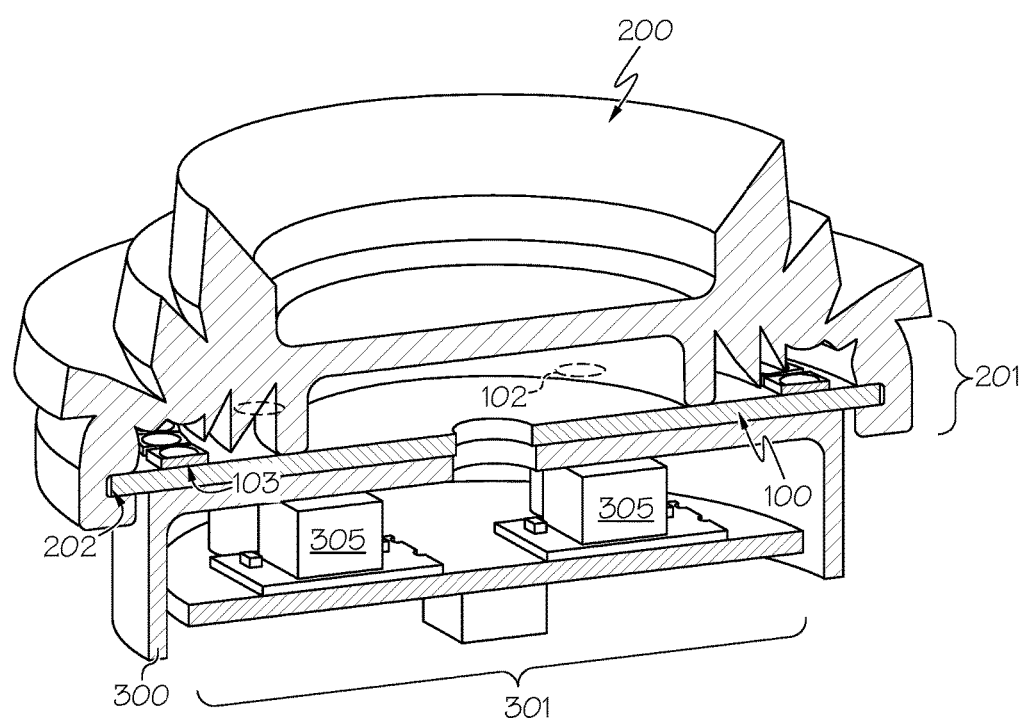
FIG. 3 is a cross-sectional illustration of the single, refractive optic element of FIG. 2 retained directly to the LED printed circuit card of FIG. 1 in a self-sealing manner without mechanical fasteners in accordance with some embodiments of the present disclosure.

FIG. 3 is a cross-sectional illustration of the single, refractive optic element 200 of FIG. 2 retained directly to the LED printed circuit card assembly 100 of FIG. 1 in a self-sealing manner without mechanical fasteners in accordance with some embodiments of the present disclosure. In this embodiment, it is immediately apparent how the notch 202 of the sealing perimeter portion 201 functions to "self-seal" about the LED-containing surface of the LED printed circuit card assembly 100 without any mechanical fasteners, with the periphery (radially outward from the LED components 103) of the printed circuit card 101 being disposed within the notch 202. In this manner, the sealing perimeter portion 201 surrounds three surfaces of the printed circuit card 101 (upper, lower, and radially-outer, as illustrated), which provides a strong seal both for retaining the optic element 200 to the LED printed circuit card assembly 100 and for excluding environment contaminants from the LED components 103. Opposite the LED component-containing surface of the printed circuit card 101, the LED printed circuit card assembly 100 is physically secured to a support portion 300 of the aircraft anti-collision lighting module using, for example, screws or other fasteners that may be disposed through openings 102 of the printed circuit card 101. The support portion 300 may also enclose electrical leads 305 that supply electrical power to the LED printed circuit card assembly 100, which in turn may be supported on a substrate 301. In this regard, the LED printed circuit card assembly 100 may also be electrically connected with the electrical leads 305 enclosed within the support portion 300.

Figure 4:
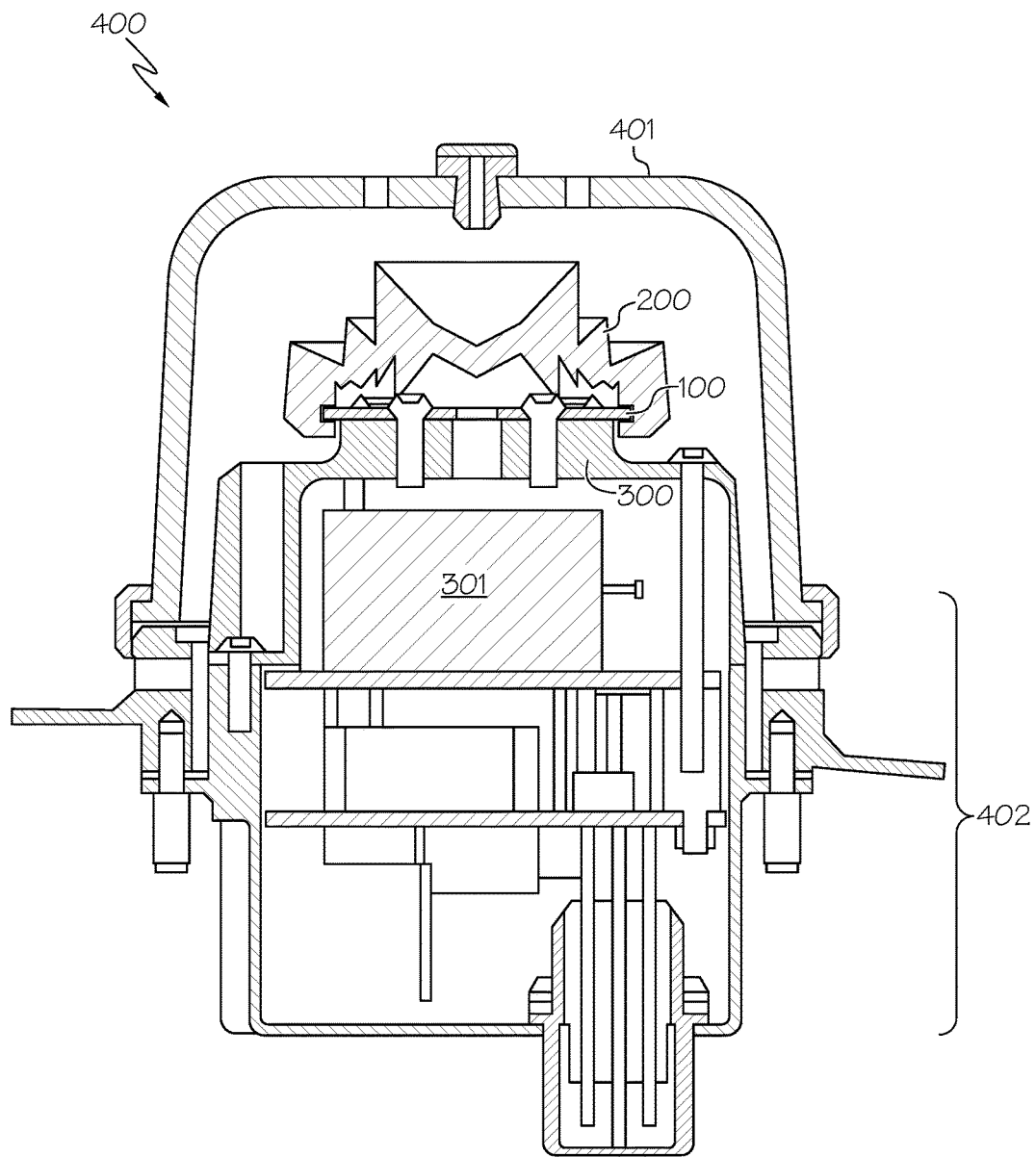
FIG. 4 is a cross-sectional view of an aircraft anti-collision lighting module that incorporates the environmentally-sealed refractive lighting optic of the present disclosure.
Figure 5:
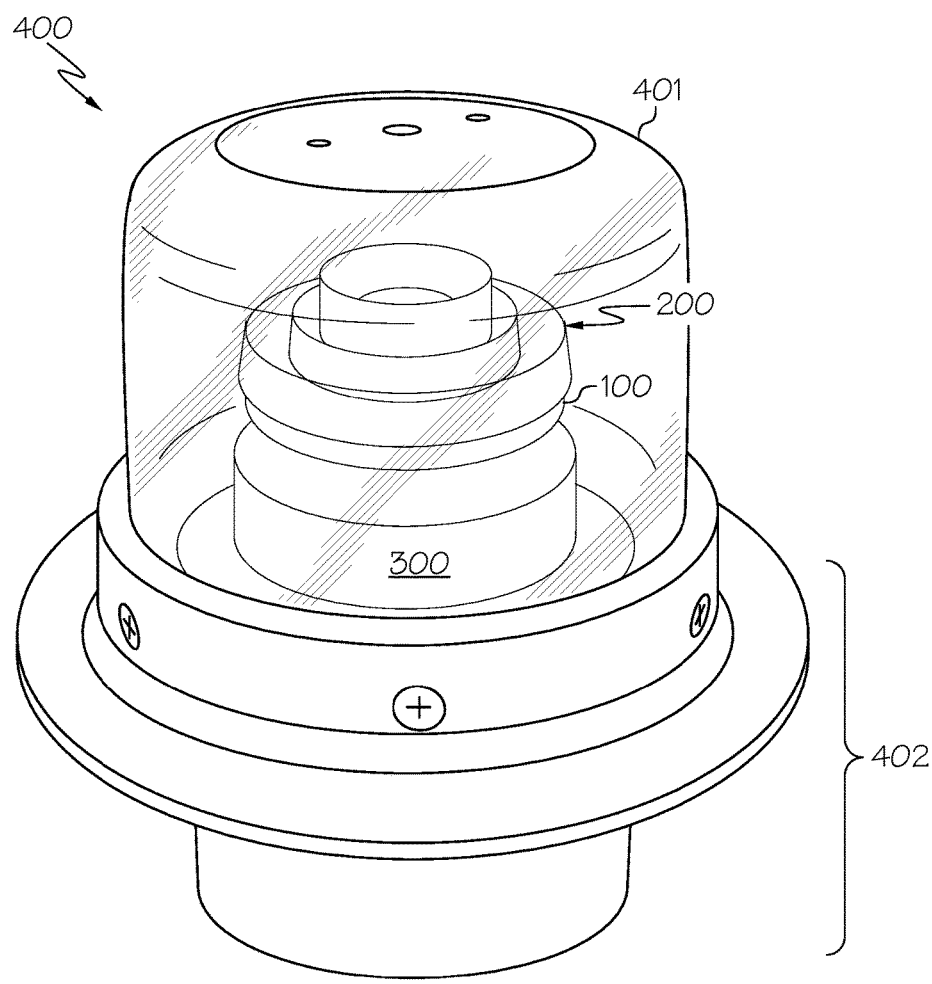
FIG. 5 is a perspective view of an aircraft anti-collision lighting module that incorporates the environmentally-sealed refractive lighting optic of the present disclosure.

FIG. 4 is a cross-sectional view, and FIG. 5 is a perspective view, of an aircraft anti-collision lighting module 400 that incorporates the environmentally-sealed refractive lighting optic 100/200 of the present disclosure. As illustrated, the LED printed circuit card assembly 100, the optic element 200, and the support portion 300 are enclosed within a lens 401. Lens 401, in turn, is physically secured to module base portion 402. Lens 401 may be a transparent glass or thermoplastic material, and may be provided with various colors, filtering effects, prismatic effects, and environmental drainage provisions, as are appropriate to the particular implementation on a given aircraft. The environmentally-sealed refractive lighting optic 100/200 of the present disclosure should be sized and configured so as to fit within the lens 401 and onto the module base portion 402, the particular sizing of which again depends on the particular implementation on a given aircraft.

Module base portion 402 may generally include all of the conventional elements of an anti-collision lighting system that are necessary to couple with the aircraft both physically and electrically at the designated receptacle of the aircraft. According to an exemplary embodiment, the lighting module 400 may be configured so that lens 401 projects from the base portion 402 at a vertical angle that is designed to reduce the drag coefficient. Moreover, the overall design of the anti-collision lighting module 400 takes other aerodynamic considerations into account. For example, a relatively large diameter of the base portion 402 with respect to the height helps reduce the protrusion of the anti-collision lighting module 400 into the airflow, thereby reducing the drag coefficient.

Accordingly, the present disclosure has provided embodiments of an environmentally-sealed refractive lighting optic that may be used for aircraft anti-collision lighting. The described LED lighting optic may be utilized as a form and fit replacement for existing xenon tubes and reflectors. The described embodiments completely environmentally seal the LED components on the LED printed circuit card using a non-conductive refractive optic element. This configuration allows the optic element to be retained directly to the LED printed circuit card to improve the optic tolerance condition while using no mechanical fastener components and providing an environmental seal for the LEDs. Accordingly, the described embodiments are expected to significantly reduce the size, weight, and power consumption of aircraft anti-collision lighting systems, while increasing their service life.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. An environmentally-sealed refractive lighting optic comprising:
 a single light-emitting diode (LED) printed circuit card comprising a plurality of LED components; and
 a single, refractive optic element retained directly to the LED printed circuit card in a self-sealing manner without mechanical fasteners, wherein the refractive optic element is configured to environmentally seal the LED components on the LED printed circuit card, and wherein an inner surface of the refractive optic element is spaced apart from the plurality of LED components by a void space.

2. The refractive lighting optic of claim 1, wherein the refractive optic element comprises a liquid silicone rubber material.

3. The refractive lighting optic of claim 1, wherein the refractive optic element comprises an optically-clear low-pressure molded room temperature vulcanizing (RTV) silicone material.

4. The refractive lighting optic of claim 1, wherein the plurality of LED components are disposed in in an annular pattern about a periphery of the single LED printed circuit card.

5. The refractive lighting optic of claim 1, wherein the single LED printed circuit card comprises one or more holes there-through for receiving a fastening element that fastens the single LED printed circuit card to an underlying support portion.

6. The refractive lighting optic of claim 1, wherein the underlying support portion comprises one or more electrical leads that supply electricity to the single LED printed circuit card.

7. The refractive lighting optic of claim 1, wherein the refractive optic element comprises one or more angular features on its outward-facing surface that are configured to refract light.

8. The refractive lighting optic of claim 7, wherein the refractive optic element comprises one or more valley-type feature between the one or more angular features on its outward facing surface.

9. The refractive lighting optic of claim 1, wherein the refractive optic element comprises one or more angular features on its inward-facing surface that are configured to refract light.

10. The refractive lighting optic of claim 1, wherein the refractive optic element comprises a sealing perimeter portion that comprises an annular notch.

11. The refractive light optic of claim 10, wherein the annular notch extends a radial distance into the sealing perimeter portion and has a thickness perpendicular to the radial direction that is similar in dimension with respect to a thickness of the single LED printed circuit card.

12. The refractive optic of claim 11, wherein the sealing perimeter portion surrounds and physically contacts each of an upper surface, a lower surface, and a radially-outer surface of the single LED printed circuit card.

13. An aircraft anti-collision lighting module comprising:
   a module base portion;
   the refractive lighting optic of claim 1, disposed on the module base portion; and
   a lens coupled to the module base portion and surrounding and covering over the refractive lighting optic of claim 1.

14. The aircraft anti-collision lighting module of claim 13, wherein the aircraft anti-collision lighting module is configured as a form and fit replacement for a conventional xenon/strobe aircraft anti-collision lighting module.

15. An aircraft comprising the aircraft anti-collision lighting module of claim 13.

* * * * *